United States Patent
Ealey

(10) Patent No.: US 7,174,792 B2
(45) Date of Patent: Feb. 13, 2007

(54) MULTI-AXIS TRANSDUCER

(75) Inventor: Mark A. Ealey, Littleton, MA (US)

(73) Assignee: Xinetics, Inc., Devens, MA (US)

( * ) Notice: Subject to any disclaimer, the term of this patent is extended or adjusted under 35 U.S.C. 154(b) by 53 days.

(21) Appl. No.: 10/914,450

(22) Filed: Aug. 9, 2004

(65) Prior Publication Data

US 2006/0027031 A1 Feb. 9, 2006

(51) Int. Cl.
*G01D 7/00* (2006.01)

(52) U.S. Cl. .................................. 73/862.041

(58) Field of Classification Search ........... 73/862.041
See application file for complete search history.

(56) References Cited

U.S. PATENT DOCUMENTS

| 4,634,917 A | * | 1/1987 | Dvorsky et al. ............. 310/328 |
| 4,885,498 A | * | 12/1989 | Wakita ........................ 310/328 |
| 4,932,119 A | | 6/1990 | Ealey et al. .................. 29/593 |
| 5,055,734 A | * | 10/1991 | Grawey et al. ............. 310/366 |
| 5,245,734 A | | 9/1993 | Issartel ....................... 29/25.35 |
| 5,347,870 A | | 9/1994 | Dosch et al. .................. 73/769 |
| 5,607,535 A | * | 3/1997 | Tsukada et al. ............. 156/252 |
| 6,215,230 B1 | * | 4/2001 | Ide et al. ..................... 310/366 |
| 6,260,248 B1 | * | 7/2001 | Cramer et al. ............. 29/25.35 |
| 6,437,487 B1 | * | 8/2002 | Mohr, III et al. ........... 310/365 |
| 6,720,711 B2 | * | 4/2004 | Iino et al. ................... 310/332 |
| 6,834,419 B2 | * | 12/2004 | Lopatin et al. ............. 29/25.35 |
| 6,947,201 B2 | * | 9/2005 | Ealey ........................ 359/295 |
| 6,951,048 B2 | * | 10/2005 | Maruyama et al. ........ 29/25.35 |

* cited by examiner

*Primary Examiner*—Michael Cygan
*Assistant Examiner*—Octavia Davis
(74) *Attorney, Agent, or Firm*—Iandiorio & Teska

(57) ABSTRACT

An improved multi-axis transducer includes a stack of ferroelectric layers and a plurality of common electrodes and addressing electrodes alternately disposed between the ferroelectric layers; each of the addressing electrodes including a number of sections electrically isolated from each other and forming a set with corresponding sections in other addressing electrodes; a common conductor is electrically connected to the common electrodes and a number of addressing conductors is, each one, electrically connected to a different set of the sections of the addressing electrodes.

22 Claims, 10 Drawing Sheets

MULTI-AXIS TRANSDUCER

FIELD OF THE INVENTION

This invention relates to an improved multi-axis transducer and more particularly to such an improved multi-axis transducer which may be monolithic, integrated and have three degrees of freedom.

BACKGROUND OF THE INVENTION

Conventional three degrees of freedom cylinder actuator/sensors are constructed of three semi-cylindrical longitudinal walls separated by semi-cylindrical longitudinal insulator portions. There is an inner diameter electrode and outer diameter electrode for each wall. In the actuator mode when all three walls have an equal voltage simultaneously applied the transducer acts as a piston creating displacement in the Z-axis. When voltages are applied unequally X and Y-axis displacement are created: the amount and direction of displacement is dependent on the relative magnitude of the voltage applied to the walls. D=f(V). One shortcoming of these devices is that the walls are 40–100 mils in radial thickness. Since the typical piezoceramic material from which they are built requires 25 volts per mil, such devices require very high voltage supplies e.g. 1,000–2,500 v. In the sensor mode a force exerted along the Z axis equally on all three walls generates equal, similar voltages, e.g. typically fractions of a millivolt from each wall, while a force applied unequally results in each wall developing a different voltage representative of the direction of the force in the X and Y axes. Since voltage is a function of the force and thickness: V=F/t, these conventional transducers of 40–100 mils thickness have a relatively low sensitivity. Also see U.S. Pat. Nos. 5,347,870, 4,885,498, 5,245,734 and 4,932,119.

BRIEF SUMMARY OF THE INVENTION

It is therefore an object of this invention to provide an improved multi-axis transducer.

It is a further object of this invention to provide such an improved multi-axis transducer which requires much less voltage when operated as an actuator.

It is a further object of this invention to provide such an improved multi-axis transducer which has much greater sensitivity when operated as an sensor.

It is a further object of this invention to provide such an improved multi-axis transducer which can be monolithically fabricated by co-firing instead of using adhesives such as epoxy.

It is a further object of this invention to provide such an improved multi-axis transducer which is less expensive and stiffer as a result of co-firing and generates greater force over a greater bandwidth.

It is a further object of this invention to provide such an improved multi-axis transducer which performs well as a three degree of freedom device.

It is a further object of this invention to provide such an improved multi-axis transducer in which the electrodes are integrated with the transducer.

It is a further object of this invention to provide such an improved multi-axis transducer which may have three, four, five, six or any number of axes.

The invention results from the realization that a truly improved multi-axis transducer which is capable of operating at lower voltage as an actuator and is more sensitive as a sensor is achieved by alternating common and addressing electrodes in a stack of ferroelectric layers, wherein each addressing electrode includes a number of electrically isolated sections which form a set with corresponding sections in other addressing electrodes and either applying a voltage across layers to cause a displacement in the actuator mode or in the sensor mode sensing the voltage across the layers representative of an applied force.

This invention features an improved multi-access transducer including a stack of ferroelectric layers and a plurality of common electrodes and addressing electrodes alternately disposed between the ferroelectric layers. Each of the addressing electrodes includes a number of sections electrically isolated from each other and forming a set with corresponding sections of the other addressing electrodes. There is a common conductor electrically connected to the common electrodes and a number of addressing conductors each one electrically connected to a different set of the sections of the addressing electrodes.

In a preferred embodiment the transducer may be an actuator and each of the addressing conductors may apply a voltage to its associated set of addressing electrode sections. The transducer may be a sensor and each of the addressing conductors may sense a voltage from its associated set of addressing electrode sections. The transducer may include a co-located sensor-actuator. The transducer may include a seismic mass and a suspension system interconnecting the seismic mass with each of the sets of addressing electrode sections for generating voltages representing the orientation of the transducer. The transducer may be cylindrical and each of the electrodes may be annular. Each of the electrodes may include at least two sections. The addressing electrodes may include sensor addressing electrodes and actuator addressing electrodes. The addressing conductors may include sensor-addressing conductors for connection with the sensor addressing electrodes and actuator addressing conductors for connection with the actuator addressing electrodes. The $d_{33}$ axis of the ferroelectric layers may be generally perpendicular do the layers. The $d_{31}$ axis of the ferroelectric layers may be generally parallel to the layers. The sections on each addressing electrode may be alternately sensor sections and actuator sections. Each of the common electrodes may include a number of recessed portions for defining a contact path for the addressing conductors with the addressing electrodes. In at least one set of sections, the sections may include a recess portion for defining a contact path for the common conductor with the common electrodes. The layers and electrodes may be co-fired. The ferroelectric layers may be electrostrictive, piezoelectric, piezoresistive or pyroresistive.

The invention also features an improved multi-access sensor including a stack of ferroelectric layers and a plurality of common electrodes and addressing electrodes alternately disposed between the ferroelectric layers. Each of the addressing electrodes includes a number of sections electrically isolated from each other and forming a set with corresponding sections in the other addressing electrodes. There is a common conductor electrically connected to the common electrodes and a number of addressing conductors each one electrically connected to a different set of the sections of the addressing electrodes for sensing a voltage across the layers representative of a force applied to the sensor.

The invention also features an improved multi-axis actuator including a stack of ferroelectric layers and a plurality of common electrodes and addressing electrodes alternately disposed between the ferroelectric layers. Each of the addressing electrodes includes a number of sections electrically isolated from each other and forming a set with corresponding sections in the other addressing electrodes. There is a common conductor electrically connected to the common electrodes and a number of addressing conductors each one electrically connected to a different set of the sections of the addressing electrodes for applying a voltage across the layers to generate a displacement by the actuator.

The invention also features an improved multi-axis co-located sensor-actuator including a stack of ferroelectric layers and a plurality of common electrodes and addressing electrodes alternately disposed between the ferroelectric layers. Each of the addressing electrodes includes a number of sections electrically isolated from each other and forming a set with corresponding sections in the other addressing electrodes. There is a common conductor electrically connected to the common electrodes and a number of addressing conductors each one electrically connected to a different set of the sections of the addressing electrodes. The addressing electrodes includes sensor addressing electrodes and actuator addressing electrodes. The addressing conductor includes sensor addressing conductors for connection with the sensor addressing electrodes and actuator addressing conductors for connection with the actuator addressing electrodes for independently, selectively, sensing a voltage across the layers representative of a force applied to the sensor-actuator and applying a voltage across the layers to generate a displacement by the sensor-actuator.

BRIEF DESCRIPTION OF THE DRAWINGS

Other objects, features and advantages will occur to those skilled in the art from the following description of a preferred embodiment and the accompanying drawings, in which.

DISCLOSURE OF THE PREFERRED EMBODIMENT

Figure 1:
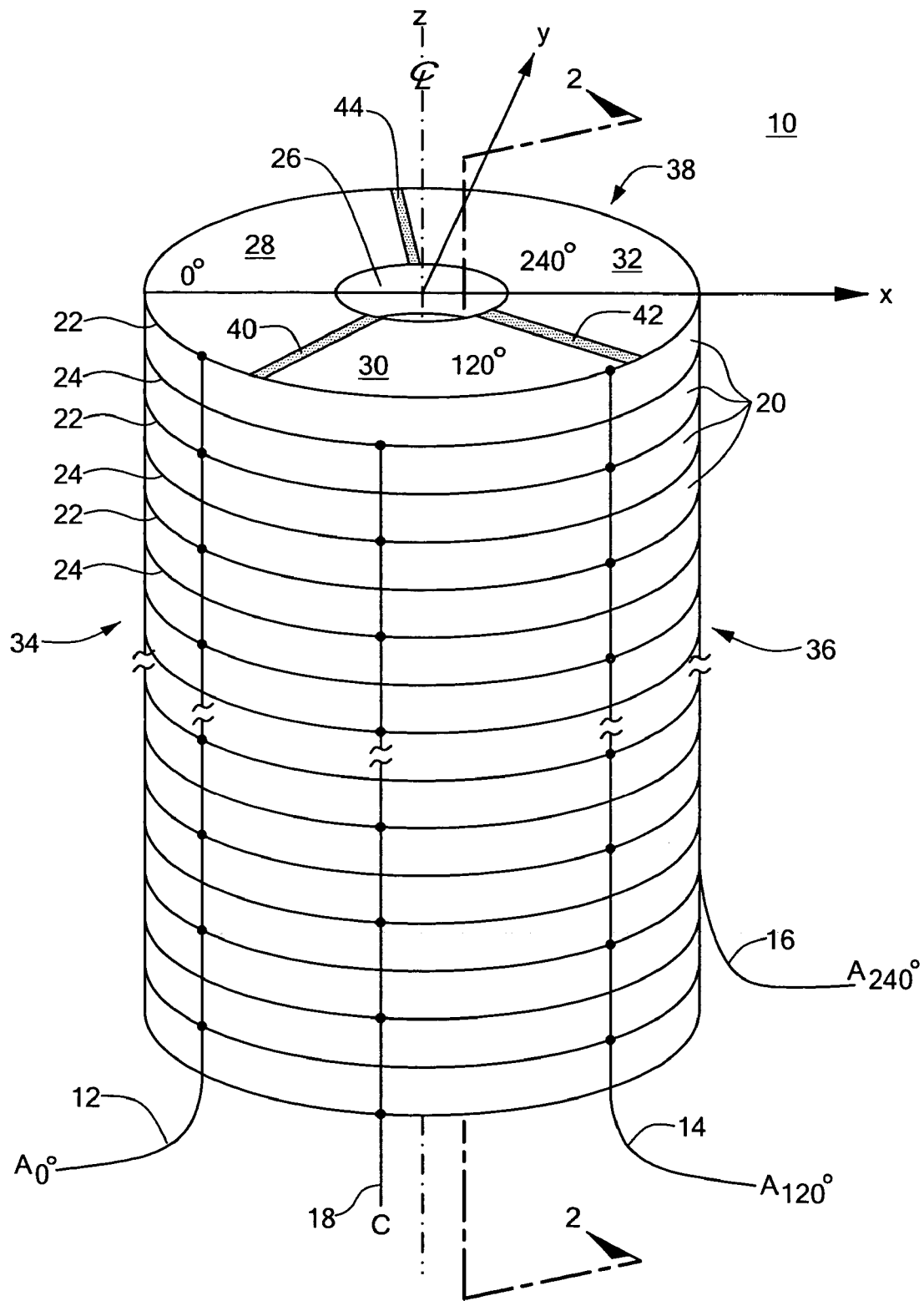
FIG. 1 is diagrammatic three-dimensional view of a multi-axis transducer according to this invention.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings.

There is shown in FIG. 1, a multi-axis transducer 10 according to this invention including addressing conductors 12, 14 and 16 and common conductor 18. Transducer 10 is formed of a plurality of layers typically numbering in the tens or hundreds. The layers are separated by electrodes, alternately common electrodes and addressing electrodes. Layers 20 are made of a ferroelectric electrodisplacive material, such as electrostrictive, piezoresistive, piezoelectric, or pryoresistive materials e.g. lead magnesium nitrate, lead zirconate titanate. Disposed between alternate layers are addressing electrodes 22 with the common electrodes 24 being interstitially alternately disposed These combinations of layers and electrodes form capacitors which may be viewed as mechanically in series and electrically in parallel. The layers 20 may be very thin, for example, 4 mils as compared to the prior art longitudinal walls which are 40 to 100 mils thick, those prior art devices required a 1000 v to 2500 v voltage supplies where as this structure using 4 mils layers would require only approximately 100 volts. Further when this transducer is operated as an actuator it will have greater displacement because it has a greater number of layers and displacement is a function of the number of layers squared times the electric field.

$$D \approx N^2 \times E \qquad (1)$$

where $$E = V/t \qquad (2)$$

and where V is the voltage and t is the thickness.

When operated as a sensor transducer 10 performance is also improved because the co-firing which results in a monolithic integrated structure increases the stiffness of the device, therefore gives it a greater sensitivity to any applied forces.

$$F \approx \rho Y/A \qquad (3)$$

where ρ is density, A is area and Y is Young's Modulus. The higher the Young's Modulus the stiffer the device and therefore the greater will be the sensitivity of the device as a sensor and the greater will be the force developed by the device as an actuator. Co-firing also produces an integrated structure wherein the electrodes, layers and even the addressing and common conductors are an integral part of the package. The greater stiffness also increases the bandwidth of the transducer $$f_r = \frac{1}{2\pi} \sqrt{\frac{k}{m}} \qquad (4)$$

where k is stiffness, m is mass and $f_r$ is the natural frequency and $$k = \frac{Ya}{l} \qquad (5)$$

where l is the length of the transducer. Co-firing is a well known fabrication process not a part of this invention which involves removing carbon from the green body during binder burnout and densifies the ceramic during sintering with the result being a monolithic multilayer stack. For further information see *Ceramic Processing and Sintering*. M. N. Rahamen, *Principles of Ceramic Processing*. James S. Reed.

Each addressing electrode 22 includes two or more sections. In FIG. 1, the addressing electrodes 22 include three sections 28, 30 and 32 but fewer two or more 6, 10, 50, 100, 500 or any number may be used limited only by the manufacturing tolerances and the resolution desired. Transducer 10 is typically cylindrical in form and circularly symmetrical about centerline C/L and may have a central hole 26 to improve its performance. Each section 28, 30, 32 in each addressing electrode 22 forms a set with a corresponding sections in the other addressing electrodes. That is to say, all of the sections 28 in all of the addressing electrodes 22 which are connected by addressing conductor 12 form a set as do all the sections 30 interconnected by addressing conductor 18 and all of the sections 32 interconnected by addressing conductor 16. These sets are referred to as 34, 36, and 38, respectively.

When transducer 10 is operated as a actuator an electric field is created in layers 20 by applying a voltage across the pairs of addressing and common electrodes through addressing conductors 12, 14 and 16 and common conductor 18. If all of the applied voltages are equal, a displacement is generated in the Z axis longitudinally, if unequal voltages are applied then the sets 34, 36, 38 of sections 28, 30, and 32 will undergo different displacements and there will be a tilting, imposing a motion in the X and Y axes as well. Each of sections 28, 30 and 32 on each of addressing electrodes 22 are electrically isolated from each other, such as by insulating portions 40, 42 and 44.

Figure 2:
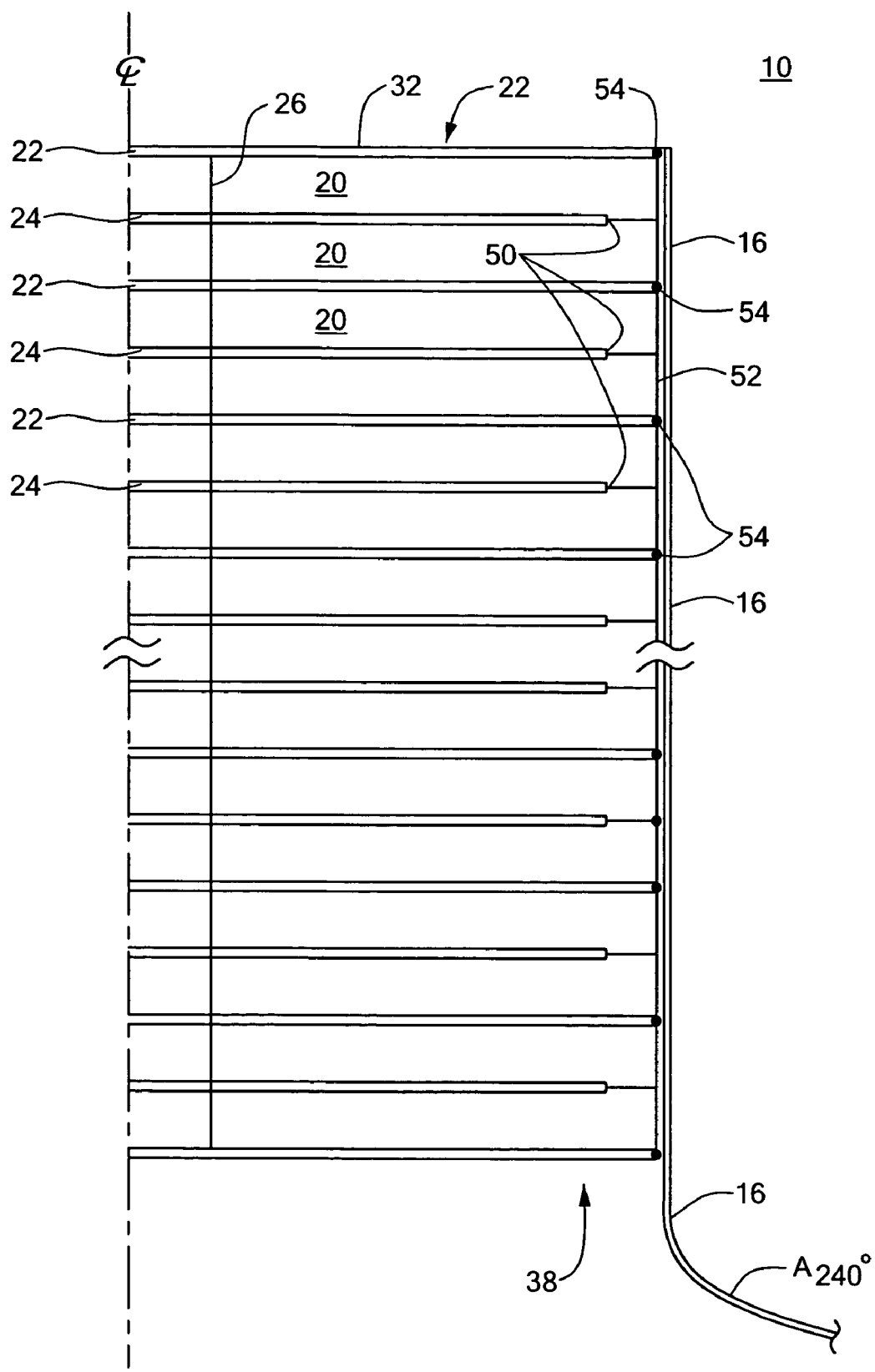
FIG. 2 is a diagrammatic side elevation sectional view along line 2—2 of FIG. 1.

In order to ensure that the addressing conductors 12, 14 and 16 touch only addressing electrodes, not common electrodes, and that common conductor 18 touches only common electrodes, not addressing electrodes, the addressing and common electrodes are suitably configured with recesses. For example, each of common electrodes 24, FIG. 2 is recessed from the edge 52 of the stack of layers 20 so that it cannot electrically connect to addressing conductor 16 which is electrically interconnected to each of the addressing electrodes 22, such as at terminals 54. Similar recessing is done of the addressing electrodes to avoid contact with all but the common conductor.

Figure 3:
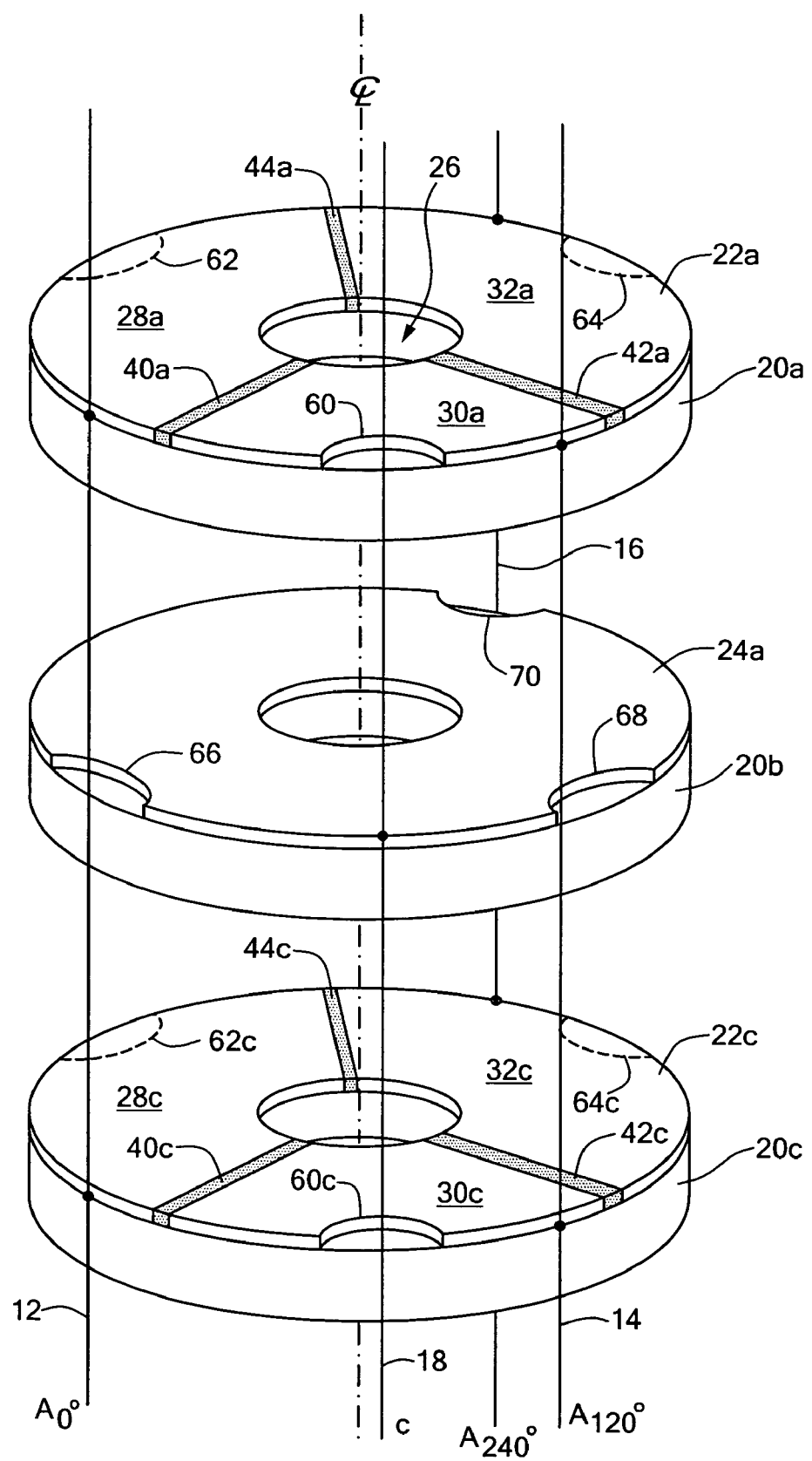
FIG. 3 is an enlarged, exploded diagrammatic view of a portion of the transducer of FIG. 1 including several layers.

This construction can be seen in more detail in FIG. 3, where three layers 20a, 20b and 20c are shown in exploded isometric view. Addressing electrode 22a includes three sections 28a, 30a and 32a electrically separated by insulators 40a, 42a, and 44a. A portion of section of 30a is recessed as at 60, in fact only one recess is needed where there is typically only one common conductor, but for ease of manufacturing and assembly recesses are often provided in each of the sections as shown in phantom at 62 and 64. Common electrode 24a includes three recesses 66, 68, and 70 to be sure that there is no contact with addressing conductors 12, 14, and 16, respectively. The next layer 20c includes an addressing electrode 22c having three sections, 28c, 30c, and 32c with insulators 40c, 42c, and 44c and recesses 60c, 62c, and 64c.

Figure 4:
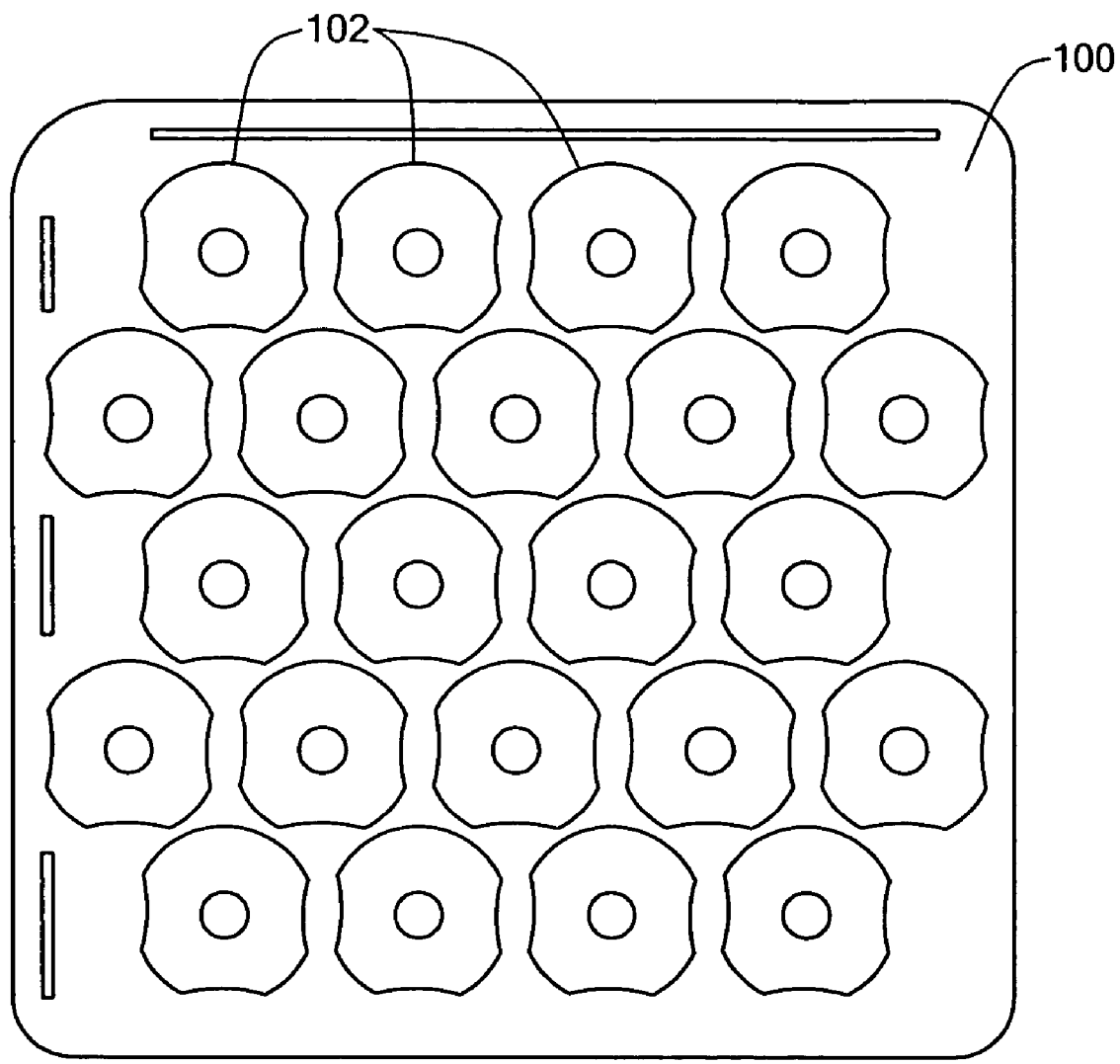
FIG. 4 is an enlarged schematic view of a layer with a pattern of common electrodes disposed therein.
Figure 5:
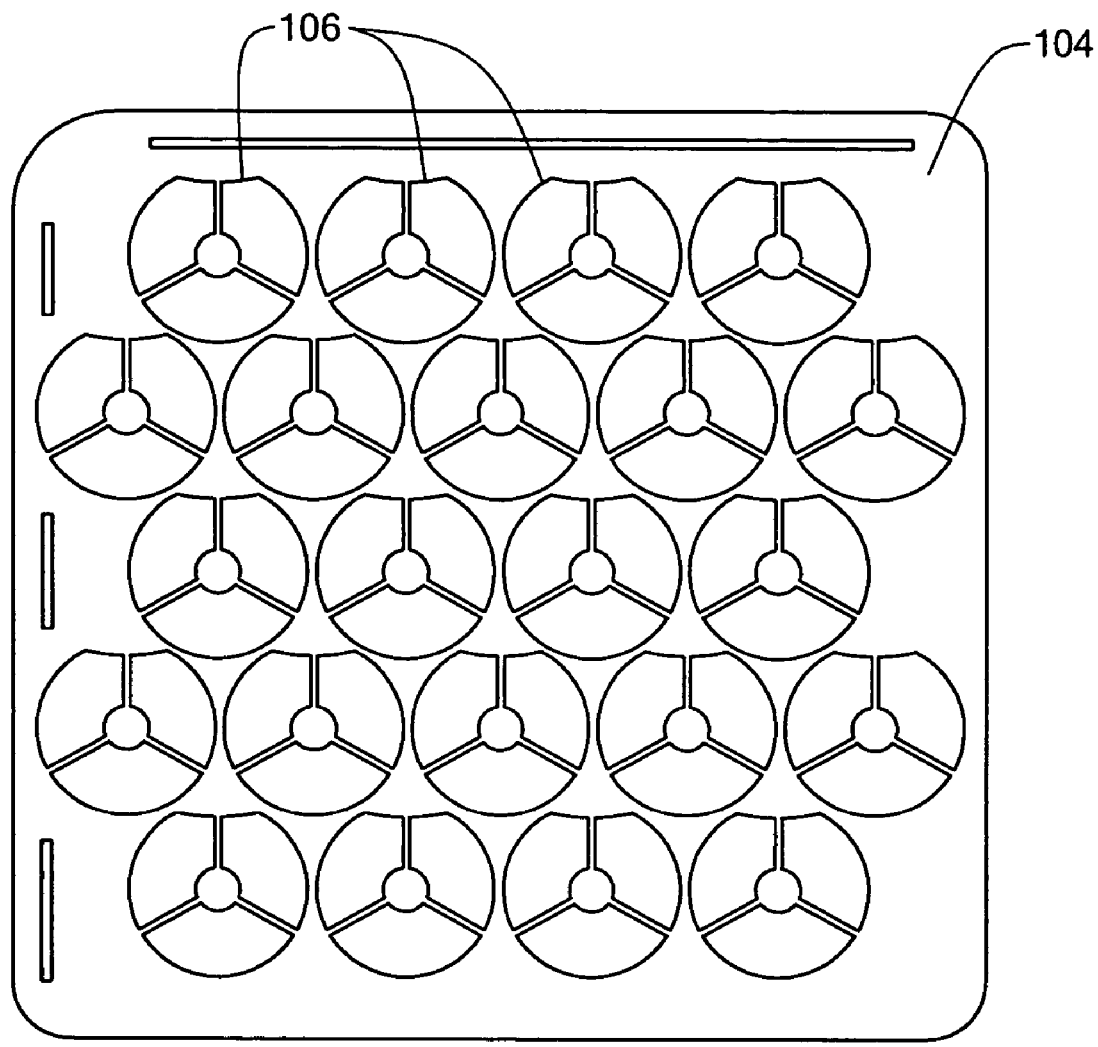
FIG. 5 is an enlarged schematic view of a layer with a pattern of addressing electrodes disposed thereon.

The transducer of this invention may be easily fabricated by fabricating a number of ferroelectric layers 100, FIG. 4, on which have been developed common electrodes 102 and fabricating a number of ferroelectric layers 104 on which have been developed a number of addressing electrodes 106, FIG. 5 Hundreds of these layers 100 and 104 are then stacked alternately and in registration following which the individual stacks of addressing and common electrodes are cut from the substrate and co-fired to form a number of transducers according to this invention.

Figure 6:
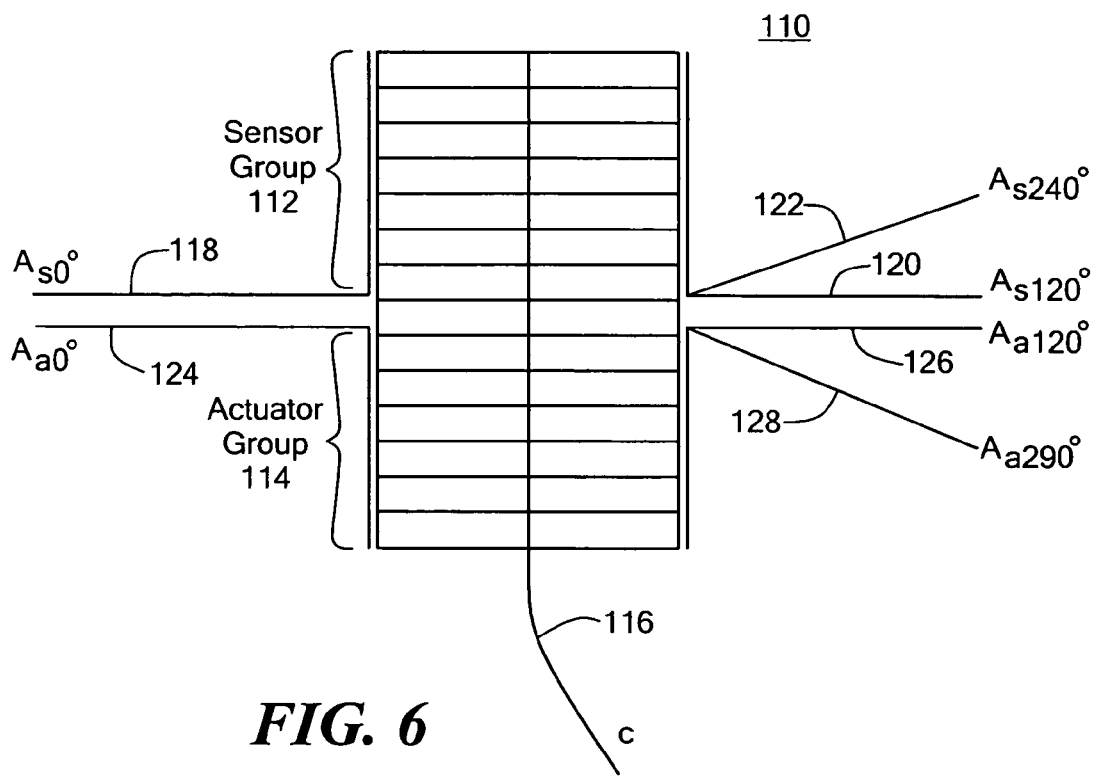
FIG. 6 is a schematic side view of a transducer similar to that of FIG. 1 implementing a co-located sensor-actuator according to this invention with the sensor and actuator portions configured longitudinally along the stack.

Although thus far the transducer has been referred to as operating as either a sensor or actuator it may function as a co-located combination sensor and actuator. Such a co-located sensor actuator 110, FIG. 6 is constructed in the same way as the transducer shown in FIGS. 1, 2 and 3, except that one group of addressing electrodes is designated the sensor group 112, and the other group of addressing electrodes is designated as the actuator group 114. There may still be one common conductor 116 but now there are addressing conductors 118, 120 and 122, one for each of the addressing electrodes in sensor group 112 and separate addressing conductors 124, 126, 128 for the addressing electrodes in the actuator group 114.

Figure 7:
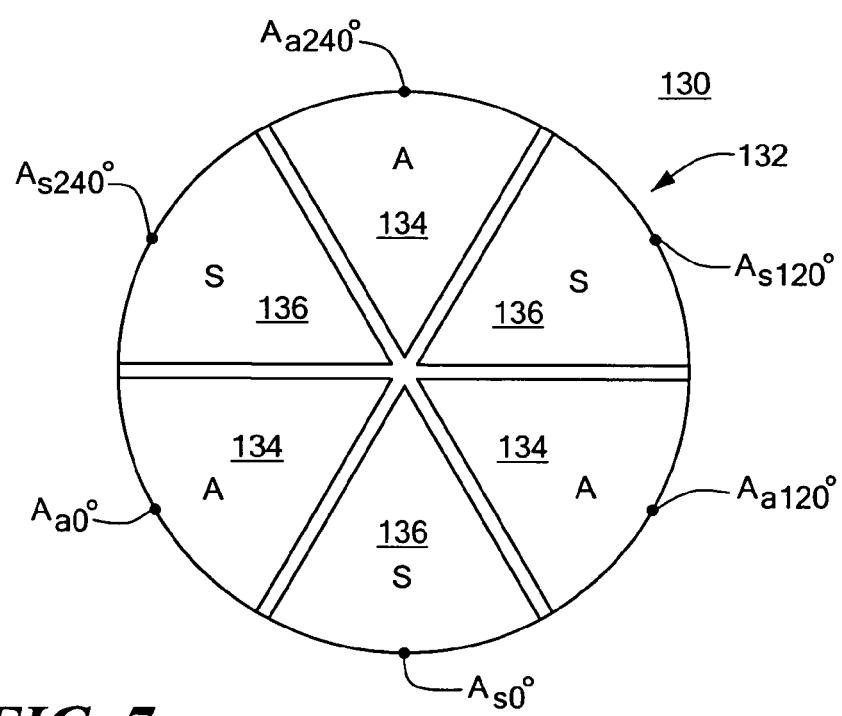
FIG. 7 is a schematic top view of a transducer similar to that of FIG. 1 implementing a co-located sensor-actuator according to this invention with the sensor and actuator portions configured circumferencially alternately around the stack.

The same co-location sensor-actuator function can be obtained using a different confirmation as shown in FIG. 7, where transducer 130 is shown having each of its addressing electrodes 132 separated into a number of sections which are alternately actuator sections 134 and sensor sections 136 disposed on the same layer. Thus each of the addressing electrodes has an alternating pattern of actuator and sensing sections which form three sets of sensing sections interstitially disposed with respect to three sets of actuator sections. In both transducers 110 and 130 in FIGS. 6 and 7, the result is a co-located integrated and monolithic, co-fired, transducer which can operate both as a sensor and as an actuator to provide both displacement and force sensing. Alternatively, the device in FIG. 6 could have every other capacitor plate act as an actuator and the interstitial ones act as a sensor, instead of having two distinct groups as shown.

Figure 8:
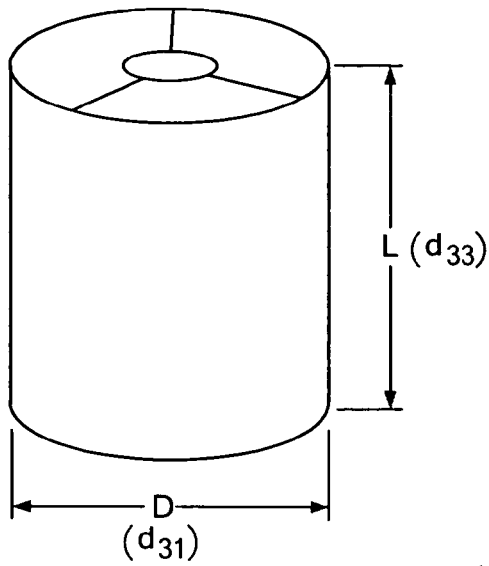
FIG. 8 is a schematic diagram of a transducer similar to that of FIG. 1 illustrating the $d_{33}$ axis conformation.
Figure 9:
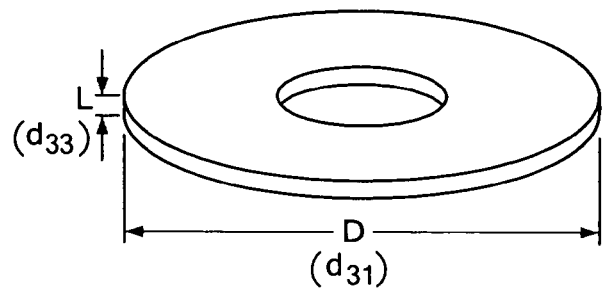
FIG. 9 is a schematic diagram of a transducer similar to that of FIG. 1 illustrating the $d_{31}$ axis conformation.
Figure 10:
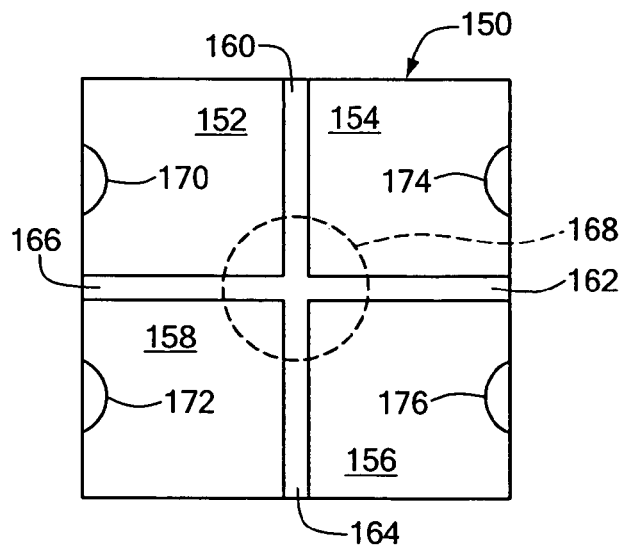
FIGS. 10 and 11 are schematic plan views of addressing and common electrodes, respectively, having square shapes according to this invention.
Figure 11:
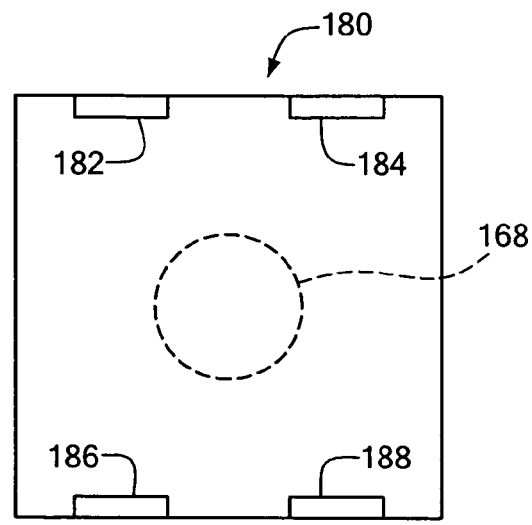
Figure 12:
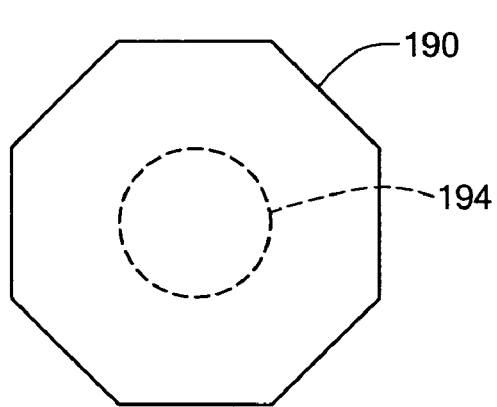
FIGS. 12 and 13 are views of octagonal and triangular shaped electrodes according to this invention.
Figure 13:
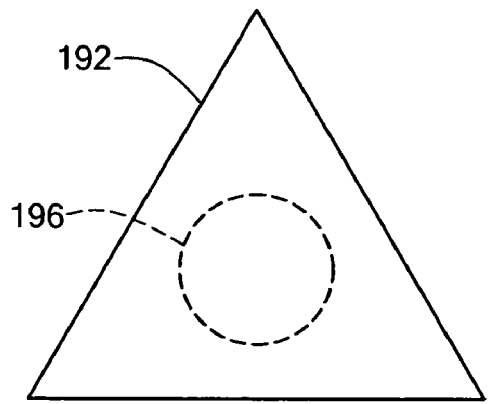

With the configuration shown thus far, where the transducer is shaped as an elongated cylinder, as shown in FIG. 8, where the length L is much greater than the diameter D, the better performance is along the longitudinal access or the $d_{33}$ axis. However, the transducer of this invention works just as well when $d_{31}$ is the preferred axis, if the aspect ratio is reversed so that the diameter D, FIG. 9, is much greater than the length L. Although thus far the geometry of the transducer has been depicted as a cylinder, this is not a necessary limitation of the invention, for example, it might be a rectangle and have a rectangular addressing electrode 150, FIG. 10, with four sections 152, 154, 156 and 158 separated by insulating members 160, 162, 164, and 166 and having no center hole 168 shown in phantom to emphasize its presence/absence. Rectangular addressing electrode 150 might have recesses 170, 172, 174, 176 any one or more of which would accommodate avoidance of a common conductor. FIG. 11 shows a common electrode 180 which might have recesses 182, 184, 186, 188 for accommodating avoidance of each of the four addressing conductors which interconnect with sections 152, 154, 156, and 158, FIG. 10. There is no particular limitation on the geometry of the device. It could have any shape, for example, octagonal, as demonstrated by the common electrode 190, FIG. 12, or even triangular as illustrated by common electrode 192, FIG.

13, where again phantom holes 194 and 196 have been shown to illustrate that the holes may or may not be present in the device.

Figure 14:
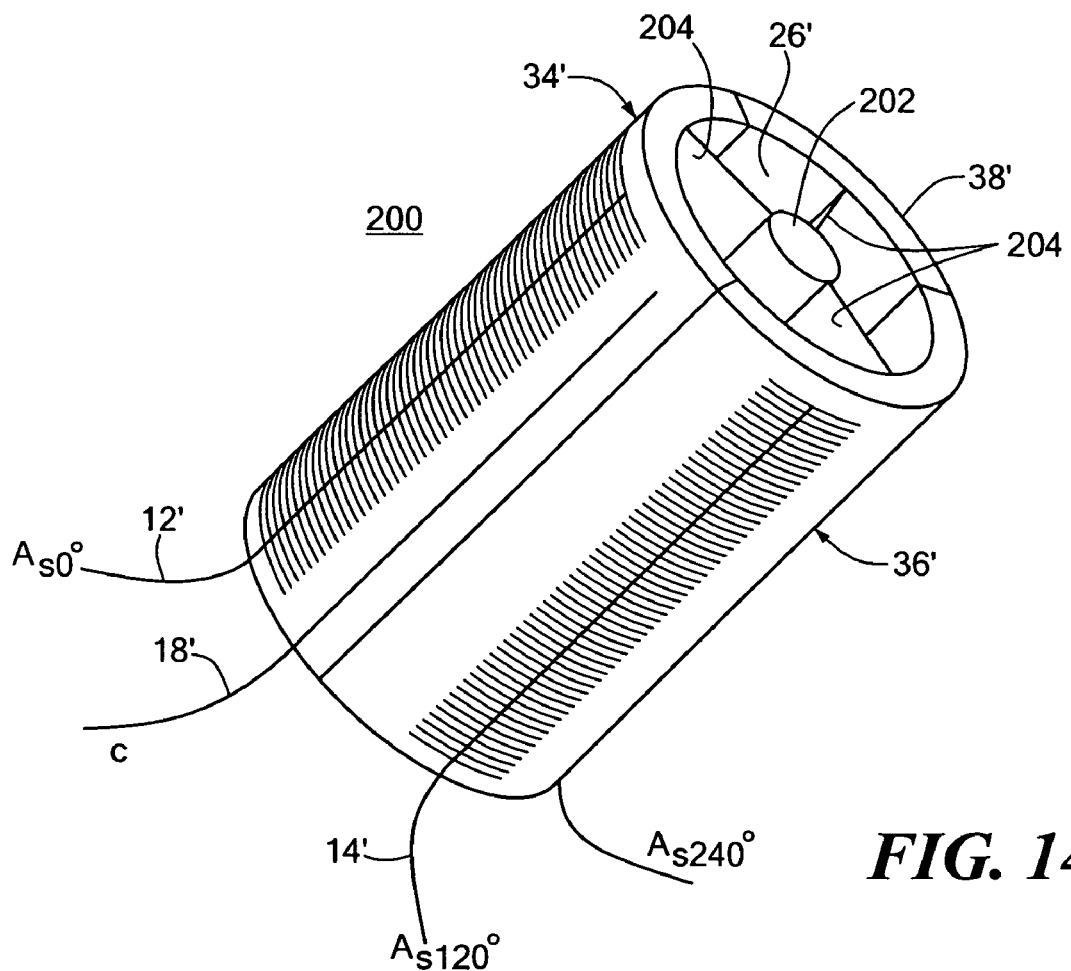
FIG. 14 is a schematic, three dimensional view of a transducer with a seismic mass according to this invention for measuring angular acceleration and as an angle sensor or accelerometer.

In addition to acting as a actuator or sensing device transducer according to this invention may also be made to operate as an angle sensor or even an accelerometer. For example, as shown in FIG. 14, transducer 200 may perform as before with a seismic mass 202 suspended for example as triaxial cantilever structure 204 in center hole 26'. Then any movement off plumb will cause the sets of sections 34', 36', 38' to experience different forces. The differences in forces are representative of the angle orientation of the device which can be duly decoded in ways well known not a part of this invention. Further the voltage output signals which represent the forced distribution on transducer 200 can be interpreted as to their rate of change as well so that transducer 200 can perform as an accelerometer as well.

Figure 15:
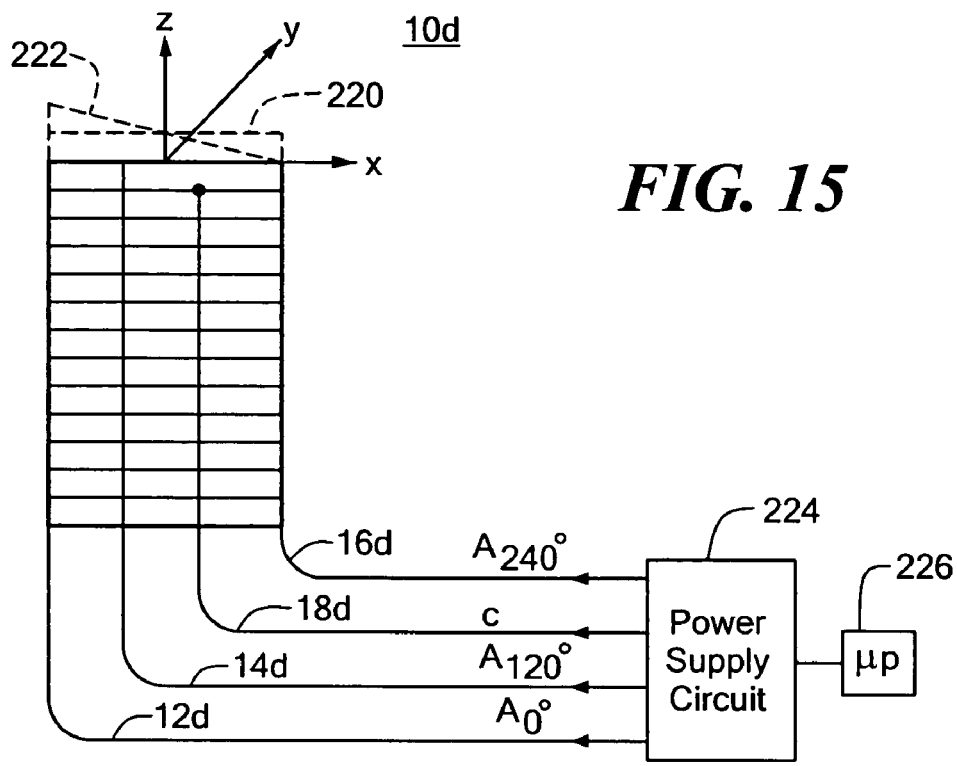
FIGS. 15–18 are schematic diagrams of alternative constructions of this invention.
Figure 16:
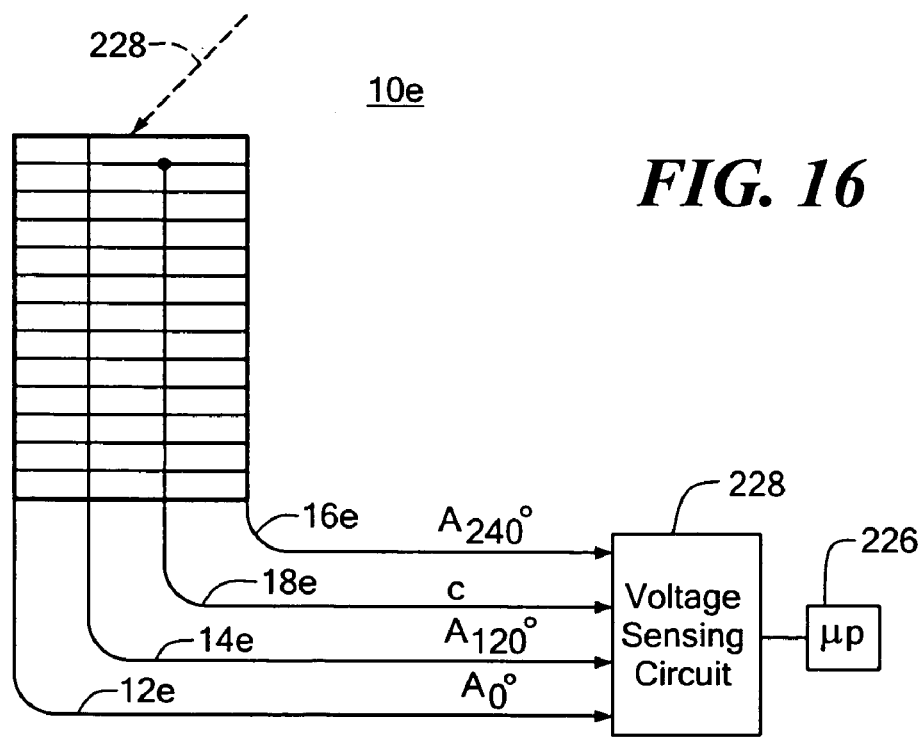
Figure 17:
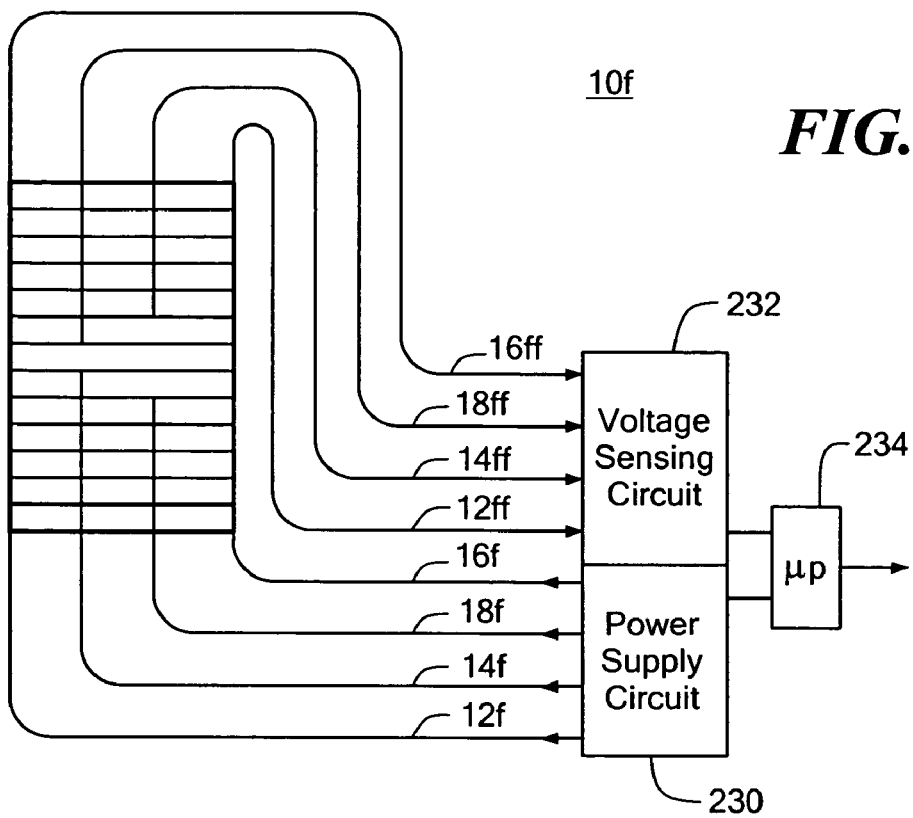
Figure 18:
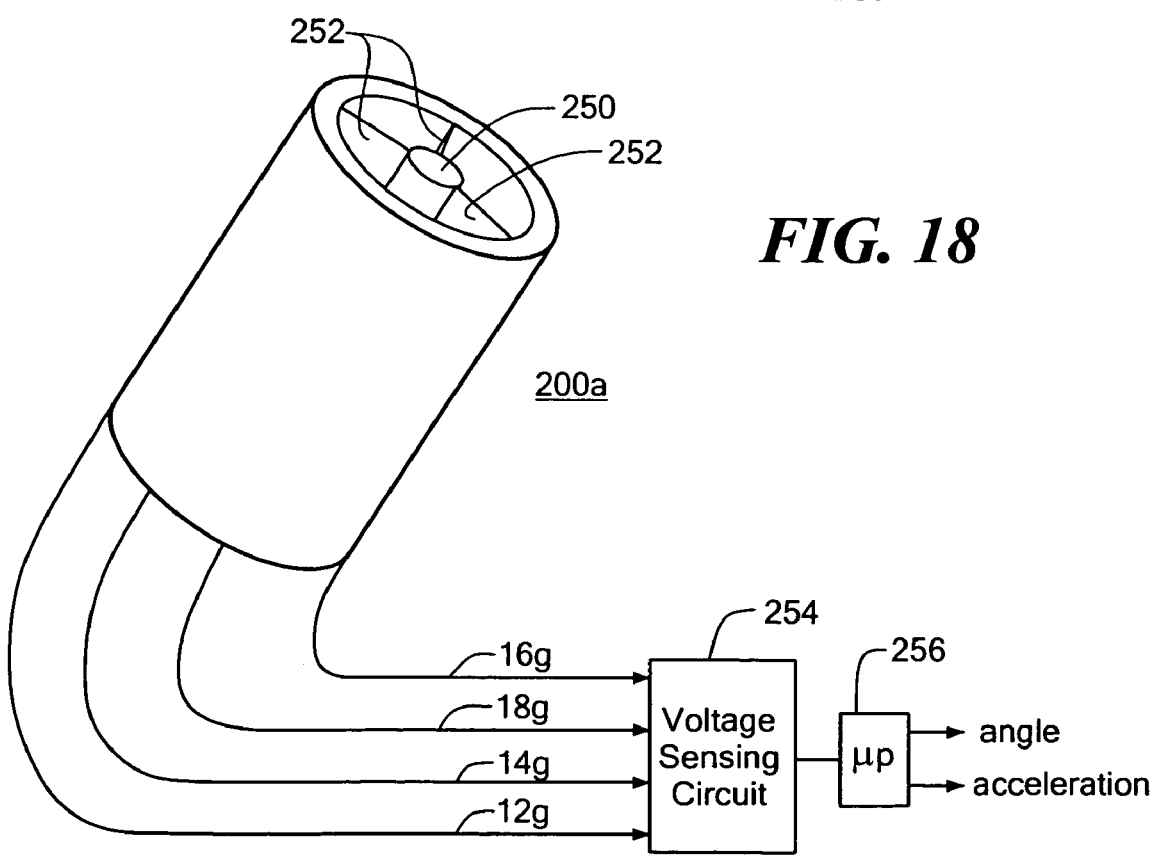

The versatility of the transducer of this invention is illustrated with respect to FIGS. 15–18. In FIG. 15, transducer 10d may be made to produce piston displacement 220 along the z-axis or a tilt 222 along the X, Y, and Z-axis by a proper pattern of voltages on addressing conductors 12d, 14d, and 16d and common conductor 18d, provided by power supply 224, for example, under the control of a micro-processor 226. The force 228 exerting on transducer 10e, FIG. 16, may be detected as to its magnitude and direction by sensing the voltages on addressing conductors 12e, 14e, and 16e, and common conductor 18e, through voltage sensing circuit 228 as interpreted by microprocessor 226, for example. The simultaneous operation of co-located sensor-actuator transducer 10f, FIG. 17, is accomplished by providing the proper voltages from power supply circuit 230 to addressing conductors 12f, 14f, 16f and common conductor 18f and sensing voltages on addressing conductors 12ff, 14ff, and 16ff and common conductor 18ff using voltage sensing circuit 232, wherein both voltage sensing circuit 232 and power supply circuit 230 may be operated with respect to microprocessor 234 so that transducer 10f can be enabled to sense a force applied to it and simultaneously respond to that force with the displacement to offset any displacement that would be caused by the force. Finally, transducer 200a employing seismic mass 250 and suspension system 252 may provide voltage outputs on addressing conductors 12g, 14g, and 16g and common conductor 18g, representative of the magnitude and direction of the force applied to it as sensed by sensing circuit 254 to calculate both the angle and the rate of change of the angle or acceleration using a microprocessor 256 or similar device.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

Other embodiments will occur to those skilled in the art and are within the following claims:

What is claimed is:

1. An improved multi-axis transducer comprising:
   a stack of ferroelectric layers;
   a plurality of common electrodes and addressing electrodes alternately disposed between the ferroelectric layers;
   each of said addressing electrodes including a number of sections electrically isolated from each other and forming a set with corresponding sections in the other addressing electrodes;
   a common conductor electrically connected to said common electrodes; and
   a number of addressing conductors, each one electrically connected to a different said set of said sections of said addressing electrodes.

2. The improved multi-axis transducer of claim 1 in which said transducer is an actuator and each of said addressing conductors applies a voltage to its associated said set of addressing electrode sections.

3. The improved multi-axis transducer of claim 1 in which said transducer is a sensor and each of said addressing conductors senses a voltage from its associated said set of addressing electrode sections.

4. The improved multi-axis transducer of claim 1 in which said transducer includes a co-located sensor-actuator.

5. The improved multi-axis transducer of claim 1 in which said transducer includes a seismic mass and a suspension system interconnecting said seismic mass with said sets of addressing electrode sections for generating voltages representing the orientation of the transducer.

6. The improved multi-axis transducer of claim 1 in which said transducer is cylindrical and each of said electrodes is annular.

7. The improved multi-axis transducer of claim 1 in which of said electrodes includes at least two sections.

8. The improved multi-axis transducer of claim 4 in which said addressing electrodes include sensor addressing electrodes and actuator addressing electrodes.

9. The improved multi-axis transducer of claim 8 in which said addressing conductors include sensor addressing conductors for connection with said sensor addressing electrodes and actuator addressing conductors for connection with said actuator addressing electrodes.

10. The improved multi-axis transducer of claim 1 in which the $d_{33}$ axis of the said ferroelectric layers is generally perpendicular to the layers.

11. The improved multi-axis transducer of claim 1 in which the $d_{31}$ axis of said ferroelectric layers is generally parallel to the layers.

12. The improved multi-axis transducer of claim 4 in which said sections on each addressing electrode are alternately sensor sections and actuator sections.

13. The improved multi-axis transducer of claim 1 in which each of said common electrodes includes a number of recessed portions for defining a contact path for said addressing conductors with said addressing electrodes.

14. The improved multi-axis transducer of claim 1 in which each in at least one set of sections, the sections include a recessed portion for defining a contact path for said common conductor with said common electrodes.

15. The improved multi-axis transducer of claim 1 in which said layers and electrodes are co-fired.

16. The improved multi-axis transducer of claim 1 in which said ferroelectric layers are electrostrictive.

17. The improved multi-axis transducer of claim 1 in which said ferroelectric layers are piezoelectric.

18. The improved multi-axis transducer of claim 1 in which said ferroelectric layers are piezoresistive.

19. The improved multi-axis transducer of claim 1 in which said ferroelectric layers are pyroresistive.

20. An improved multi-axis sensor comprising:
   a stack of ferroelectric layers;

a plurality of common electrodes and addressing electrodes alternately disposed between the ferroelectric layers;

each of said addressing electrodes including a number of sections electrically isolated from each other and forming a set with corresponding sections in the other addressing electrodes;

a common conductor electrically connected to said common electrodes; and a number of addressing conductors, each one electrically connected to a different said set of said sections of said addressing electrodes for sensing a voltage across said layers representative of a force applied to the sensor.

21. An improved multi-axis actuator comprising:

a stack of ferroelectric layers;

a plurality of common electrodes and addressing electrodes alternately disposed between the ferroelectric layers;

each of said addressing electrodes including a number of sections electrically isolated from each other and forming a set with corresponding sections in the other addressing electrodes;

a common conductor electrically connected to said common electrodes; and a number of addressing conductors, each one electrically connected to a different said set of said sections of said addressing electrodes for applying a voltage across said layers to generate a displacement by said actuator.

22. An improved multi-axis co-located sensor-actuator comprising:

a stack of ferroelectric layers;

a plurality of common electrodes and addressing electrodes alternately disposed between the ferroelectric layers;

each of said addressing electrodes including a number of sections electrically isolated from each other and forming a set with corresponding sections in the other addressing electrodes;

a common conductor electrically connected to said common electrodes; and a number of addressing conductors, each one electrically connected to a different said set of said sections of said addressing electrodes; said addressing electrodes including sensor addressing electrodes and actuator addressing electrodes, and said addressing conductors including sensor addressing conductors for with said sensor addressing electrodes and actuator addressing conductors for connection with said actuator addressing electrodes for independently, selectively sensing a voltage across said layers representative of a force applied to the sensor-actuator and applying a voltage across said layers to generate a displacement by said sensor-actuator.

* * * * *